United States Patent
Nishi et al.

[11] Patent Number: 5,854,767
[45] Date of Patent: Dec. 29, 1998

[54] SEMICONDUCTOR MEMORY DEVICE HAVING A PLURALITY OF BLOCKS EACH INCLUDING A PARALLEL/SERIAL CONVERSION CIRCUIT

[75] Inventors: Kazuyoshi Nishi; Hironori Akamatsu, both of Hirakata; Toshiaki Tsuji, Takatsuki; Hisakazu Kotani, Takarazuka, all of Japan

[73] Assignee: Matsushita Electric Industrial Co., Ltd., Kadoma, Japan

[21] Appl. No.: 548,671

[22] Filed: Oct. 26, 1995

[30] Foreign Application Priority Data

Oct. 28, 1994 [JP] Japan .................................. 6-265314

[51] Int. Cl.[6] ...................................... G11C 7/00
[52] U.S. Cl. ........................ 365/219; 365/230.03
[58] Field of Search ................................ 365/219, 220, 365/221, 230.03

[56] References Cited

U.S. PATENT DOCUMENTS

| | | | |
|---|---|---|---|
| 3,898,632 | 8/1975 | Spencer | 365/219 |
| 4,821,226 | 4/1989 | Christopher | 365/230.03 |
| 4,945,518 | 7/1990 | Muramatsu | 365/219 |
| 5,086,388 | 2/1992 | Matoba | 365/219 |
| 5,222,047 | 6/1993 | Matsuda | 365/230.03 |
| 5,307,323 | 4/1994 | Fukuda | 365/221 |
| 5,493,535 | 2/1996 | Cho | 365/230.03 |

Primary Examiner—A. Zarabian
Attorney, Agent, or Firm—Renner, Otto, Boisselle & Sklar, P.L.L.

[57] ABSTRACT

A semiconductor memory device according to the present invention includes a plurality of blocks. A plurality of first selection signals, second selection signals, and third selection signals are provided to the blocks. Each block includes: a memory cell array; a read/write circuit for simultaneously reading out a plurality of data from the memory cell array and subsequently simultaneously writing a plurality of further data into the memory cell array when the corresponding first selection signal is active; a parallel/serial conversion circuit for outputting the plurality of simultaneously read out data, the outputting being performed data by data in a serial manner along the time axis; a transfer gate for a reading operation controlled by the corresponding second selection signal, the gate outputting the plurality of data from the parallel/serial conversion circuit when the corresponding second selection signal is active; a serial/parallel conversion circuit for receiving the plurality of further data, the further data being sequential, and for outputting the plurality of sequential data to the read/write circuit in a parallel manner along the time axis; and a transfer gate for a writing operation controlled by the corresponding third selection signal, the gate outputting the plurality of sequential data to the serial/parallel conversion circuit when the corresponding third selection signal is active. Only one second selection signal is allowed to be active at a given time, while the other remain non-active. Only one third selection signal is allowed to be active at a given time, while the other remain non-active.

20 Claims, 10 Drawing Sheets

SEMICONDUCTOR MEMORY DEVICE HAVING A PLURALITY OF BLOCKS EACH INCLUDING A PARALLEL/SERIAL CONVERSION CIRCUIT

BACKGROUND OF THE INVENTION

1. Field of the Invention

The present invention relates to a semiconductor integrated circuit (hereinafter referred to as "IC"), and particularly to a semiconductor IC capable of incessantly receiving and/or outputting data.

2. Description of the Related Art

In recent years, semiconductor ICs such as DRAMs (Dynamic Random Access Memories) have experienced a rapid increase in their degree of integration, so that a typical recent IC is four times as integrated as ICs three years ago. In addition to this trend to higher degrees of integration, there has also been a trend to the development of IC chips for specialized uses. In the field of image processing in particular, DRAMs intended for image processing purposes (hereinafter referred to as "image DRAMs"), such as the MN4700 series manufactured by Matsushita Electronic Corporation, have been realized as commercial products in various forms.

Figure 8:
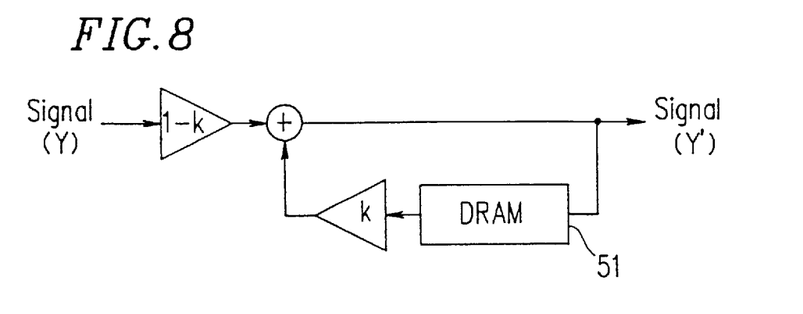
FIG. 8 is a diagram showing a system incorporating a semiconductor memory device for image processing purposes.

FIG. 8 shows an exemplary system incorporating an image DRAM 51. This system removes the noise component of an input image signal by comparing the signal against an image signal which was input immediately before that signal. In the image DRAM 51, a so-called read-modify writing operation is performed, in which data is read out from and written into the same memory cell by one selection of a row address and a column address. In other words, once a row address and a column address are selected, a signal which was input immediately before the current image signal is read out. Thereafter, the current image signal is written in the same addresses. In many cases, it is necessary to continuously read data from such an image DRAM.

Image DRAMs are required to have as large a capacity as universal DRAMS (i.e., DRAMs which are not intended for particular purposes). However, such larger capacity invites larger power consumption.

SUMMARY OF THE INVENTION

In one embodiment, a semiconductor memory device according to the present invention includes a plurality of blocks, a plurality of first selection signals and a plurality of second selection signals being provided to the plurality of blocks. Each of the plurality of blocks includes: a memory cell array; a read/write circuit for simultaneously reading out a plurality of data from the memory cell array when a corresponding one of the plurality of first selection signals is active; a parallel/serial conversion circuit for outputting the plurality of simultaneously read out data, the outputting being performed data by data in a serial manner along the time axis; and a gate controlled by a corresponding one of the plurality of second selection signals, the gate outputting the plurality of data from the parallel/serial conversion circuit when the corresponding one of the plurality of second selection signals is active. Only one of the plurality of second selection signals is allowed to be active at a given time, while the other second selection signals remain non-active.

In one embodiment of the invention, each of the plurality of first selection signals becomes active before a corresponding one of the plurality of second selection signals becomes active, and a duration of the first selection signal overlaps with a duration of the corresponding one of the plurality of second selection signals.

Alternatively, a semiconductor memory device according to the present invention includes a plurality of blocks, a plurality of first selection signals and a plurality of second selection signals being provided to the plurality of blocks. Each of the plurality of blocks includes: a memory cell array; a read/write circuit for simultaneously writing a plurality of data into the memory cell array when a corresponding one of the plurality of first selection signals is active; a serial/parallel conversion circuit for receiving the plurality of data, the data being sequential, and for outputting the plurality of sequential data to the read/write circuit in a parallel manner along the time axis; a gate controlled by a corresponding one of the plurality of second selection signals, the gate outputting the plurality of sequential data to the serial/parallel conversion circuit when the corresponding one of the plurality of second selection signals is active. Only one of the plurality of second selection signals is allowed to be active at a given time, while the other second selection signals remain non-active.

In one embodiment of the invention, each of the plurality of first selection signals becomes non-active after a corresponding one of the plurality of second selection signals becomes non-active, and a duration of the first selection signal overlaps with a duration of the corresponding one of the plurality of second selection signals.

Alternatively, a semiconductor memory device according to the present invention includes a plurality of blocks, a plurality of first selection signals, a plurality of second selection signals, and a plurality of third selection signals being provided to the plurality of blocks. Each of the plurality of blocks includes: a memory cell array; a read/write circuit for simultaneously reading out a plurality of data from the memory cell array and subsequently simultaneously writing a plurality of further data into the memory cell array when a corresponding one of the plurality of first selection signals is active; a parallel/serial conversion circuit for outputting the plurality of simultaneously read out data, the outputting being performed data by data in a serial manner along the time axis; a transfer gate for a reading operation controlled by a corresponding one of the plurality of second selection signals, the gate outputting the plurality of data from the parallel/serial conversion circuit when the corresponding one of the plurality of second selection signals is active; a serial/parallel conversion circuit for receiving the plurality of further data, the further data being sequential, and for outputting the plurality of sequential data to the read/write circuit in a parallel manner along the time axis; and a transfer gate for a writing operation controlled by a corresponding one of the plurality of third selection signals, the gate outputting the plurality of sequential data to the serial/parallel conversion circuit when the corresponding one of the plurality of third selection signals is active. Only one of the plurality of second selection signals is allowed to be active at a given time, while the other second selection signals remain non-active, and only one of the plurality of third selection signals is allowed to be active at a given time, while the other third selection signals remain non-active.

In one embodiment of the invention, each of the plurality of first selection signals becomes active before a corresponding one of the plurality of second selection signals becomes active and becomes non-active after a corresponding one of the plurality of third selection signals becomes non-active, and a duration of each of the plurality of first selection signals overlaps with a duration of the corresponding one of the plurality of second selection signals and with a duration of the corresponding one of the plurality of third selection signals.

In another embodiment of the invention, the semiconductor memory device further includes a control circuit section for generating the plurality of first selection signals and the plurality of second selection signals.

In still another embodiment of the invention, the semiconductor memory device further includes a control circuit section for generating the plurality of first selection signals, the plurality of second selection signals, and the plurality of third selection signals.

In still another embodiment of the invention, the control circuit section includes: a first input terminal for receiving from outside a first array selection signal indicating a block to be selected; a first control circuit for generating the first selection signal based on the first array selection signal; a second input terminal for receiving from outside a second array selection signal indicating a block to be selected; a second control circuit for generating the second selection signal based on the second array selection signal; a third input terminal for receiving from outside a third array selection signal indicating a block to be selected; and a third control circuit for generating the third selection signal based on the third array selection signal.

In still another embodiment of the invention, the control circuit section includes: a common input terminal for receiving from outside a common array selection signal indicating a block to be selected; and a first control circuit for generating the first selection signal based on the common array selection signal; a second control circuit for generating the first selection signal based on the common array selection signal; and a third control circuit for generating the first selection signal based on the common array selection signal.

In still another embodiment of the invention, the control circuit section further includes an input latch provided between the common input terminal and the first, second, and third control circuits, the input latch receiving and retaining the common array selection signal.

In still another embodiment of the invention, the parallel/serial conversion circuit converts every N bits of the plurality of simultaneously read out data into sequential data and outputs the converted data.

In still another embodiment of the invention, the serial/parallel conversion circuit receives the plurality of sequential data and outputs every N bits of the received data to the read/write circuit in a parallel manner along the time axis, and the read/write circuit simultaneously writes each N bits of parallel data into the memory cell array.

In still another embodiment of the invention, the plurality of blocks are formed on one chip.

The semiconductor memory device according to the present invention includes a plurality of blocks having a plurality of memory cell arrays. In the semiconductor memory device, the following three signals are provided for each block: a selection signal for controlling the inputting of data into the block; a selection signal for controlling the outputting of data from the block; and a selection signal for controlling the inputting and outputting of data in a memory cell array by a read/write circuit. As a result, the semiconductor memory device is capable of incessantly inputting or outputting data. Furthermore, in a read-modify writing operation in which the reading out and the writing of data are performed for the same memory cell by selecting a row address and a column address only once, it is possible to realize incessant inputting and outputting of data in spite of the different points in time at which data is input and output, and to reduce the power consumption of the device.

Thus, the invention described herein makes possible the advantage of providing a semiconductor memory device which is capable of incessantly receiving and/or outputting data and has an optimized configuration for realizing a small power consumption.

This and other advantages of the present invention will become apparent to those skilled in the art upon reading and understanding the following detailed description with reference to the accompanying figures.

BRIEF DESCRIPTION OF THE DRAWINGS

FIGS. 5a–5u represent a timing diagram describing a writing operation of the semiconductor memory device according to the present invention.

FIGS. 6a–6u represent a timing diagram describing a reading operation of the semiconductor memory device according to the present invention.

FIGS. 7a–7z represent a timing diagram describing a read-modify writing operation of the semiconductor memory device according to the present invention.

DESCRIPTION OF THE PREFERRED EMBODIMENTS

Figure 9:
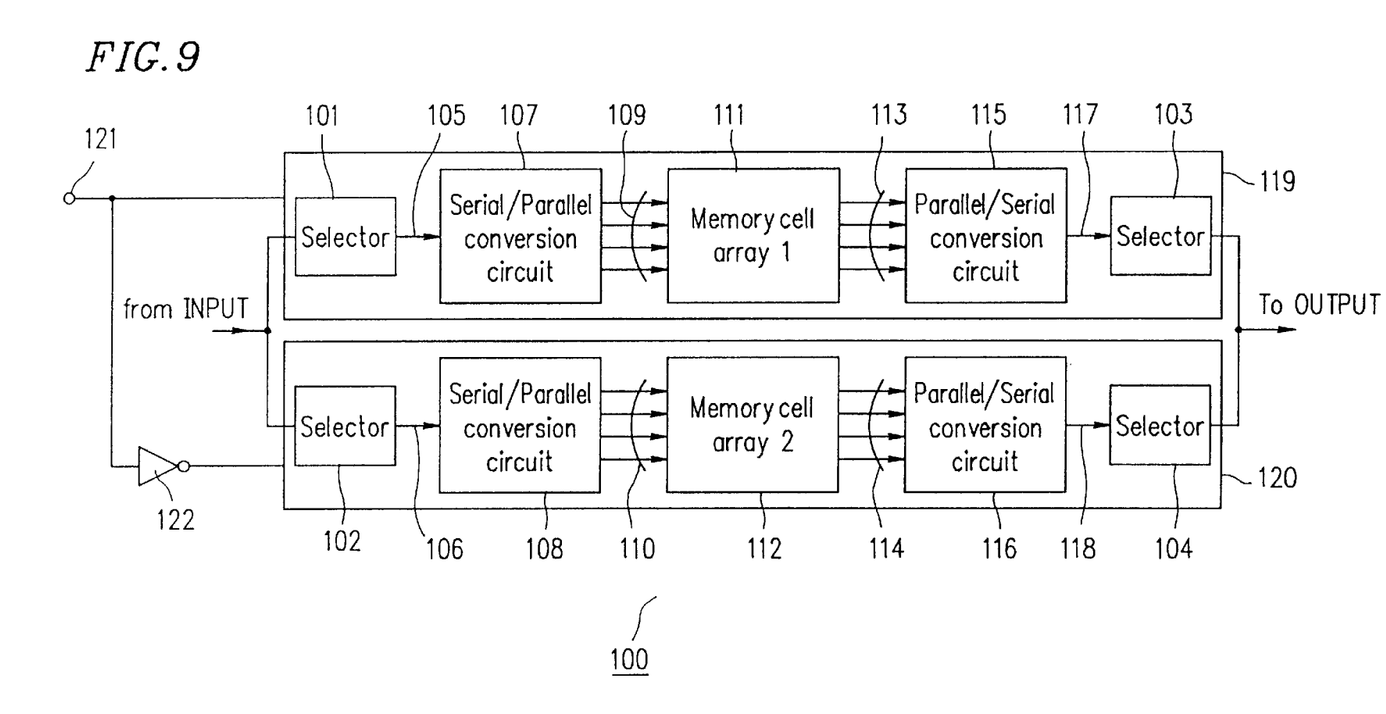
FIG. 9 is a diagram showing the configuration of a tentative semiconductor memory device.

There is a generally known method for reducing the power consumption of a semiconductor device; in this method, a memory cell array within a chip is divided into a plurality of blocks, the blocks being separately operated. Such a technique (hereinafter referred to as the "block division technique") is described in Japanese Laid-Open Patent Publication No. 4-278284, for example. The inventors of the present invention first studied the applicability of the block division technique to a conventional image DRAM in an attempt to reduce the power consumption of the image DRAM. FIG. 9 shows a semiconductor memory device 100, to which the block division technique is applied.

The semiconductor memory device 100 includes blocks 119 and 120. Either one of the blocks 119 and 120 operates at a time in accordance with externally-provided addresses which are input via a block address input terminal 121. Thus, the power consumption of the semiconductor memory device 100 is reduced. The blocks 119 and 120 each include: a selector 101 or 102 for receiving an address from the block address input terminal 121 and externally provided data, a serial/parallel conversion circuit 107 or 108 for performing a serial/parallel conversion for data provided from the selector 101 or 102, a memory cell array 111 or 112, a parallel/serial conversion circuit 115 or 116 for performing a parallel/serial conversion for data read from the memory cell array 111 or 112, and a selector 103 or 104.

Hereinafter, a read-modify writing operation will be described as an exemplary operation of the semiconductor memory device 100. For example, when an address indicating the block 119 is input to the block address input terminal 121, all the component elements within the block 119 are activated. Data input to the selector 101 is input to the serial/parallel conversion circuit 107 via a data line 105 so as to be subjected to a serial/parallel conversion. Thereafter, the data is written into the memory cell array 111 via data lines 109. The data read out from the memory cell array 111 is input to the parallel/serial conversion circuit 115 via data lines 113 so as to be subjected to a parallel/serial conversion. Thereafter, the data is output through the selector 103 via a data line 117. During the above operation, no component elements in the block 120 are activated.

Figure 10A:
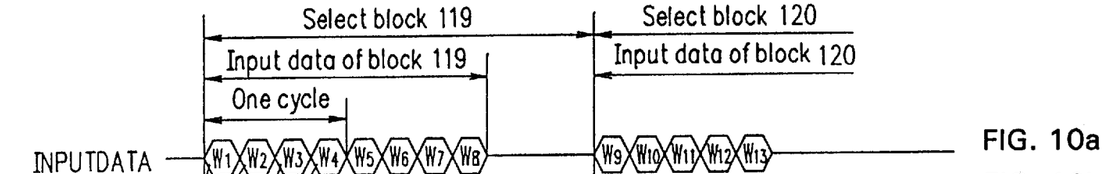
FIG. 10 is a timing diagram describing an operation of a tentative semiconductor memory device.
Figure 10B:
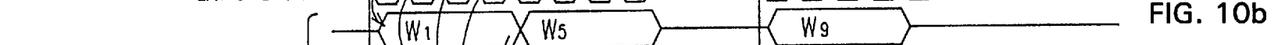
Figure 10C:
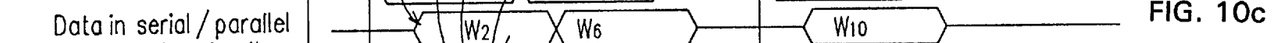
Figure 10D:
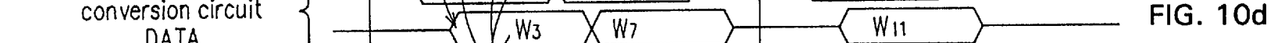
Figure 10E:
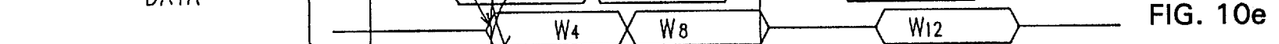
Figure 10F:
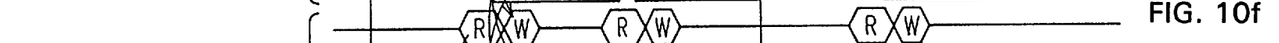
Figure 10G:
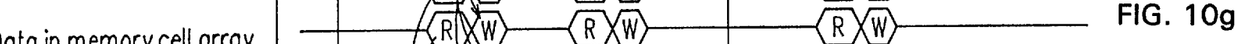
Figure 10H:
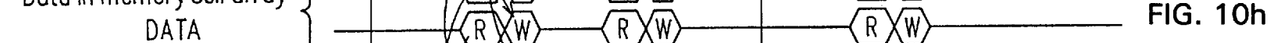
Figure 10I:
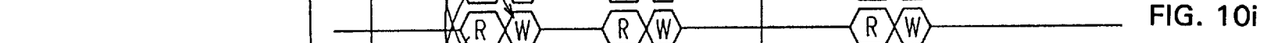
Figure 10J:
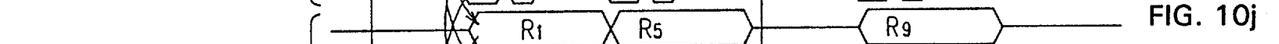
Figure 10K:
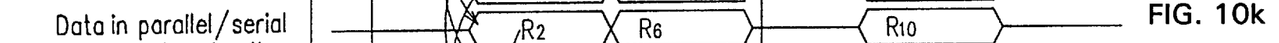
Figure 10L:
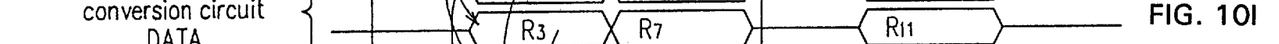
Figure 10M:
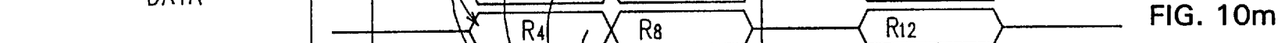
Figure 10N:
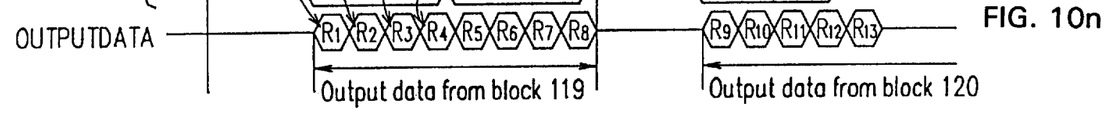

FIGS. 10a–10n show a timing diagram describing the above-mentioned operation. In this example, a 4 bit parallel/serial conversion and a 4 bit serial/parallel conversion are performed. When the block 119 is selected so that data W1 to W8 are input to the selector 101, the data W1 to W8 are subjected to a serial/parallel conversion on a cycle basis, and are sent to the memory cell array 111. In the memory cell array 111, data previously written in the addresses corresponding to data W1 to W4 (which constitute one cycle) are read out before the data W1 to W4 are written in the addresses, and are sent to the parallel/serial conversion circuit 115 as data R1 to R4. After the data R1 to R4 are read, the data W1 to W4 are written. Similarly, data R5 to R8 are read before data W5 to W8 are written. The data R1 to R8 which have been read out are then subjected to a parallel/serial conversion by the parallel/serial conversion circuit 115 so as to be output through the selector 103 as output data of the block 119.

In the case where subsequent data W9 to W13 are to be written in addresses in the memory cell array 112 of the block 120, the signal input to the block address input terminal 121 shifts to a state where it selects the block 120. However, since all the component elements in the block 119 are activated by this signal, the signal must not be switched until the data R1 to R8 are output through the selector 103 of the block 119. Therefore, it is impossible to write data in one of the blocks immediately after writing data in another block. Similarly, it is impossible to read data from one of the blocks immediately after reading data from another block.

Thus, the study by the present inventors revealed that merely applying the block technique to a conventional image DRAM cannot attain the goal of continuously receiving and/or outputting data (which is a requirement for image DRAMs) while realizing large memory capacity and reducing power consumption.

Next, the semiconductor memory device of the present invention will be described. The semiconductor memory device realizes incessant receiving and/or outputting of data by utilizing the block division technique.

Figure 1:
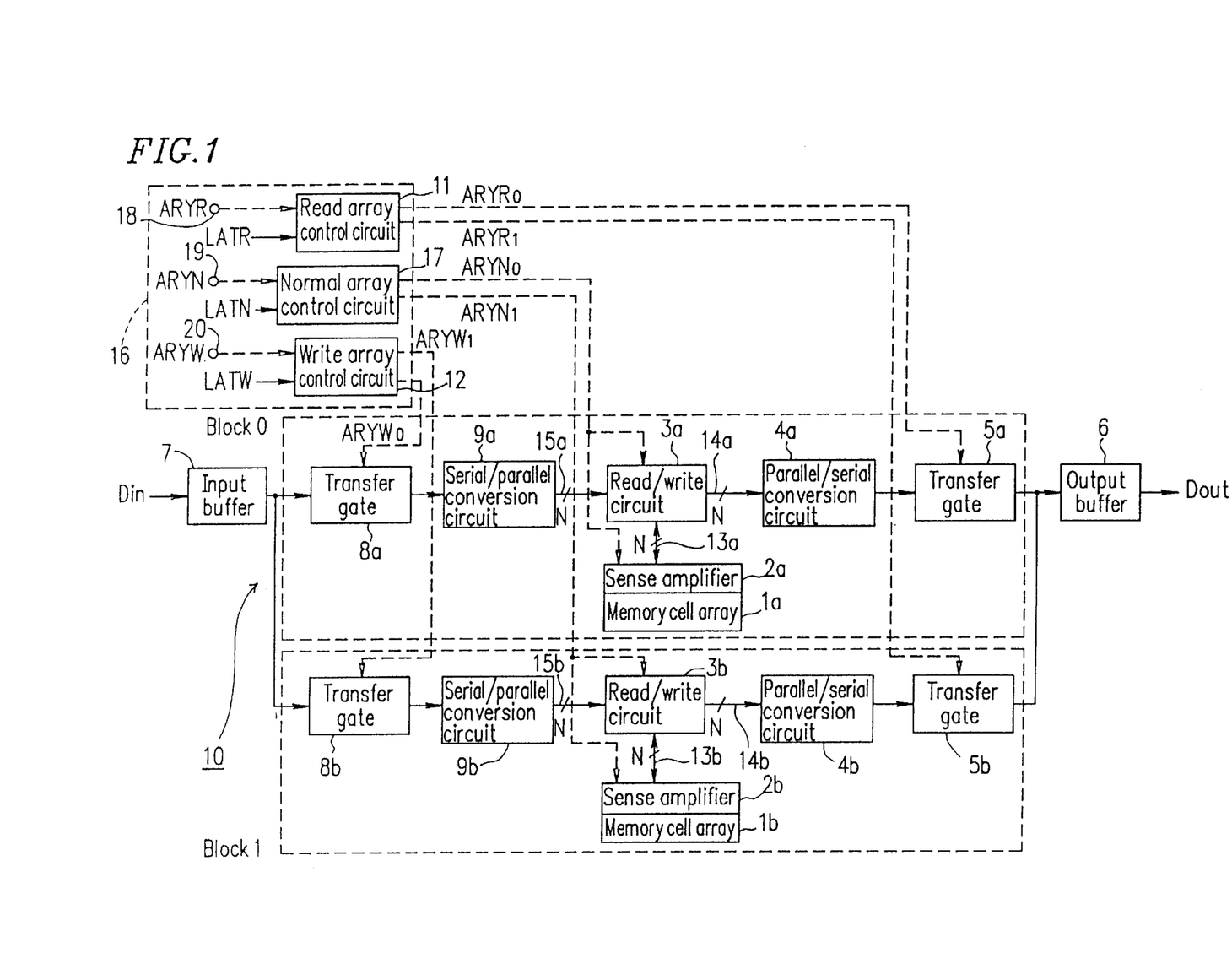
FIG. 1 is a diagram showing an exemplary configuration of a semiconductor memory device according to the present invention.

FIG. 1 is a block diagram showing one embodiment of a configuration of the semiconductor memory device 10 of the present invention. The semiconductor memory device 10 includes blocks 0 and 1, which in turn include memory cell arrays 1a and 1b, respectively. In the memory cell arrays 1a and 1b, memory cells for storing 1 bit of data each are arranged in a matrix of m rows by n columns. Thus, the memory cell arrays 1a and 1b are each capable of storing data corresponding to m rows by n columns. Sense amplifiers 2a and 2b are connected to the memory cell arrays 1a and 1b, respectively. The sense amplifiers 2a and 2b amplify one row of data in the memory cell arrays 1a and 1b, respectively. The sense amplifiers 2a and 2b are connected to read/write circuits 3a and 3b via local data buses 13a and 13b, respectively. Specifically, the local data buses 13a and 13b are local data buses having a width of N bits. The transfer of data between the sense amplifiers 2a and 2b and the read/write circuits 3a and 3b, respectively, is realized via the local data buses 13a and 13b. The read/write circuits 3a and 3b amplify readout data from the sense amplifiers 2a and 2b, respectively, during a reading operation. The read/write circuits 3a and 3b send write data to the sense amplifiers 2a and 2b, respectively, during a writing operation.

The readout data from the read/write circuits 3a and 3b are transferred to the parallel/serial conversion circuits 4a and 4b via read data buses 14a and 14b, respectively. Specifically, the read data buses 14a and 14b are read data buses having a width of N bits.

The readout data from the read/write circuits 3a and 3b are of a parallel relation with one another along the time axis (hereinafter, such data will be referred to as "parallel data"). The parallel/serial conversion circuits 4a and 4b function to convert every N bits of readout data from the read/write circuits 3a and 3b, respectively, into data which are of a serial relation with one another along the time axis (hereinafter, such data will be referred to as "serial data"), and outputs the converted data. The serial data output from the parallel/serial conversion circuits 4a and 4b are transferred to transfer gates 5a and 5b, respectively. Either one of the transfer gates 5a and 5b is selected by a read array selection signal ARYR0 or ARYR1, respectively, so as to output the serial data from the parallel/serial conversion circuit 4a or 4b, respectively, to the outside. The data from the selected one of the transfer gates 5a and 5b is transferred to an output buffer 6. The output buffer 6 outputs the data from the selected one of the transfer gates 5a and 5b as output data Dout to the outside.

Externally provided write data Din is amplified by an input buffer 7 before being input to transfer gates 8a and 8b in the blocks 0 and 1, respectively. Either one of the transfer gates 8a and 8b is selected by a write array selection signal ARYW0 or ARYW1, respectively, so as to transfer the write data from the input buffer 7 to the serial/parallel conversion circuit 9a or 9b, respectively. The write data from the transfer gates 8a and 8b are serial data. The serial/parallel conversion circuits 9a and 9b function to convert every N bits of write data from the transfer gates 8a and 8b, respectively, into parallel data, and outputs the converted data to the read/write circuits 3a and 3b via write data buses 15a and 15b, respectively. The write data buses 15a and 15b are write data buses having a width of N bits.

The above-mentioned read array selection signals ARYR0 and ARYR1, the write array selection signals ARYW0 and ARYW1, and normal array selection signals ARYN0 and ARYN1 are generated in a control circuit section 16. The normal array selection signal ARYN0 and ARYN1 are signals for operating the read/write circuits 3a and 3b and the sense amplifiers 2a and 2b. Although the control circuit section 16 is provided within the semiconductor memory device 10 in the present example, it is also applicable to provide a circuit for generating the above selection signals (ARYR1, ARYR1, ARYW0, ARYW1, ARYN0, and ARYN1) outside the semiconductor memory device 10.

The control circuit section 16 includes a read array control circuit 11, a write array control circuit 12, and a normal array control circuit 17, as well as input terminals 18, 20, and 19 to which the respective. control circuits 11, 12 and 17 are connected. The read array control circuit 11 receives a reading-purpose array selection signal ARYR via the reading-purpose array selection signal input terminal 18 in accordance with a fetch clock LATR, generates the read array selection signals ARYR0 and ARYR1, and outputs the read array selection signals ARYR0 and ARYR1 to the transfer gates 5a and 5b, respectively. The normal array control circuit 17 receives a normal-purpose array selection signal ARYN via the normal-purpose array selection signal input terminal 19 in accordance with a fetch clock LATN, and outputs the normal array selection signal ARYN0 or ARYN1 to the read/write circuit 3a and the sense amplifier 2a, or the read/write circuit 3b and the sense amplifier 2b, respectively. The write array control circuit 12 receives a writing-purpose array selection signal ARYW via the writing-purpose array selection signal input terminal 20 in accordance with a fetch clock LATW, and outputs the write array selection signal ARYW0 or ARYW1 to the transfer gates 8a and 8b, respectively.

Figure 2A:
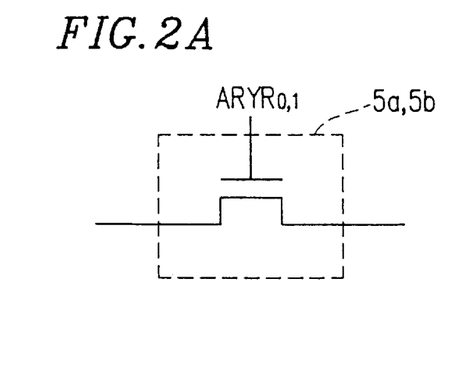
FIG. 2A is a diagram showing an exemplary configuration for a transfer gate for a writing operation.
Figure 2B:
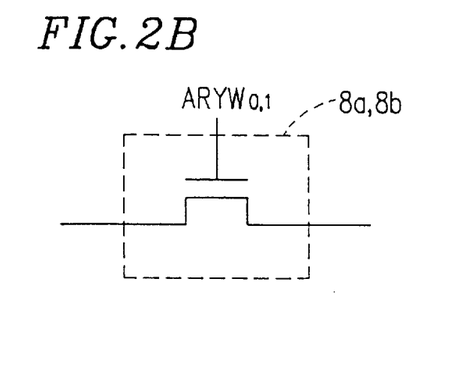
FIG. 2B is a diagram showing an exemplary configuration for a transfer gate for a reading operation.

FIGS. 2A and 2B are circuit diagrams showing the internal configurations of the transfer gates 5a and 5b for the reading operation and the transfer gates 8a and 8b for the writing operation, respectively. According to the present example, the transfer gates 5a, 5b, 8a and 8b are composed essentially of common n-type transistors. FIG. 3C is a circuit configuration diagram of the control circuit section 16 according to the present example. The control circuit section 16 is composed essentially of common D flip-flops.

Figure 4:
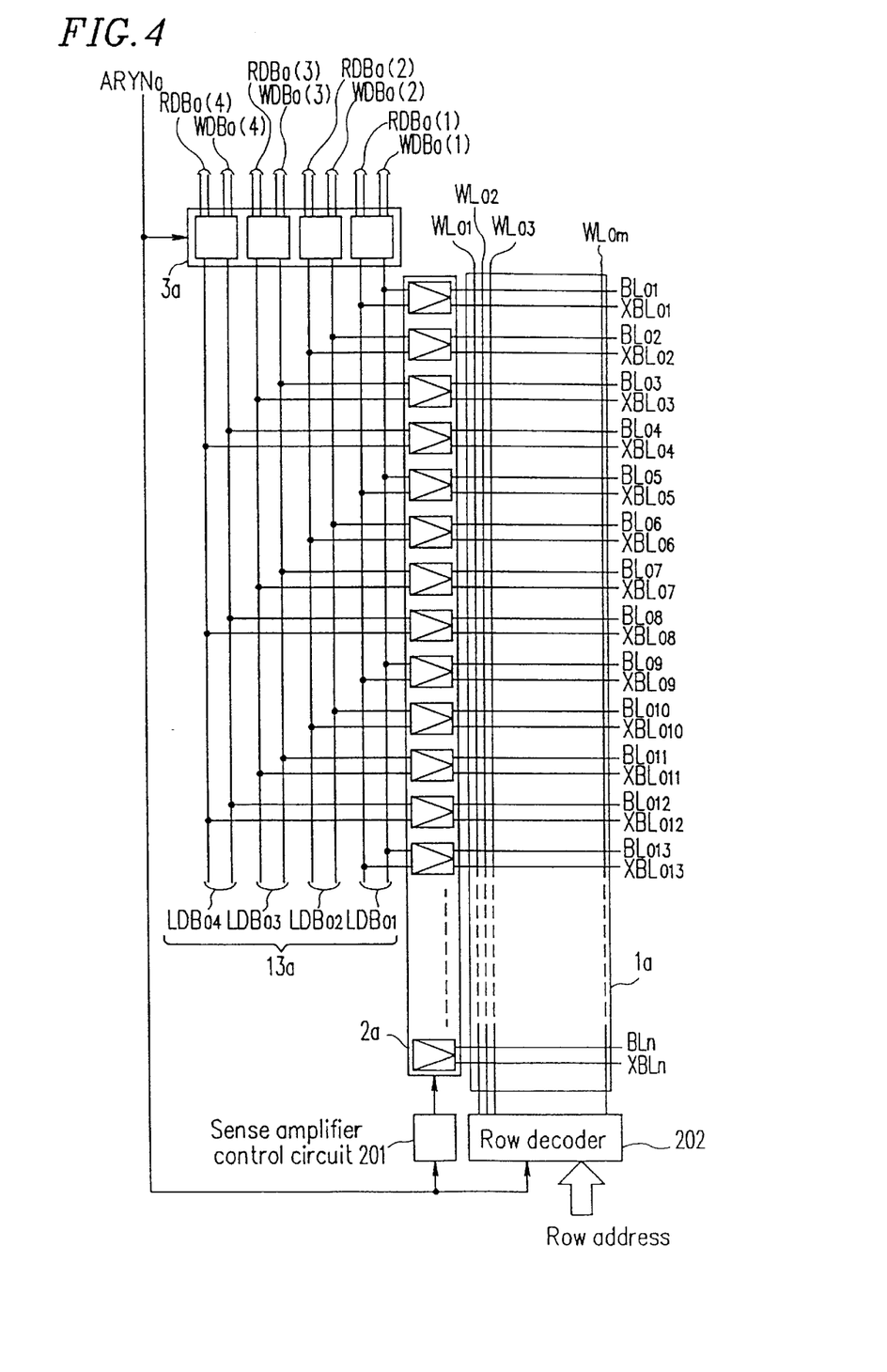
FIG. 4 is a detailed diagram showing the configuration of the semiconductor memory device shown in FIG. 1 in the vicinity of a read/write circuit thereof.

FIG. 4 shows the configurations of the read/write circuit 3a (or 3b), the sense amplifier 2a (or 2b), and the local data buses 13a (or 13b) in detail. In the present example, the local data buses 13a and 13b, the read data buses 14a and 14b, and the write data buses 15a and 15b all have a bit width of 4 bits. Moreover, write data, which is serial data, is converted into parallel data in two steps, i.e., by the serial/parallel conversion circuit 9a (or 9b) and the read/write circuit 3a or (3b) (described later). Such a two-step serial/parallel conversion requires a smaller number of data buses than a single-step serial/parallel conversion. This results in a smaller data bus width. Moreover, it preferable to perform writing operations and reading operations in the memory cell arrays at a low speed in order to perform these operations stably, so that there is no need to adopt the single-step serial/parallel conversion in order to enhance the writing/reading speed in the memory cell arrays. The parallel data read out by the read/write circuit 3a or (3b) is also converted into serial data in two steps, i.e., by the read/write circuit 3a or (3b) and the parallel/serial conversion circuit 4a (or 4b).

Figures 5A, 5U:
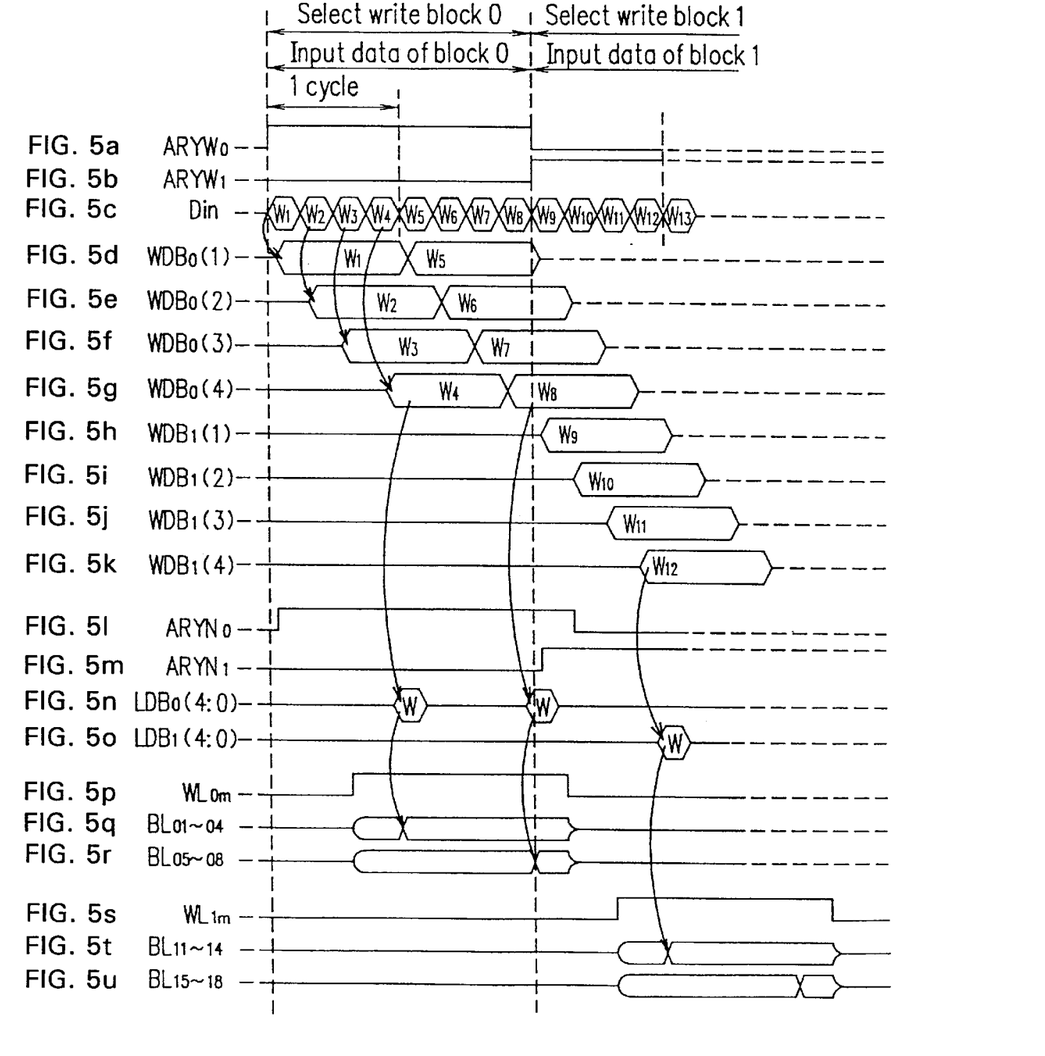

Next, the operation of the semiconductor memory device 10 having the above-described configuration will be described. First, a case will be described where the semiconductor memory device 10 only performs a writing operation, (i.e., writing of data in the memory cell arrays), with reference to FIGS. 5a–5u. The description hereinafter illustrates a case where the bit width N (where N is a positive integer) of internal parallel data is 4 (bits).

First, writing-purpose array selection signal ARYW, externally provided, is taken into the write array control circuit 12 via the writing-purpose array selection signal input terminal 20 in accordance with the fetch clock LATW. Depending on the block which the addresses (in which data are to be written) indicated by the writing-purpose array selection signal ARYW correspond to the memory cell of, the write array control circuit 12 activates one of a plurality of write array selection signals and deactivates all the other write array selection signals. Herein, a case will be described where addresses in the memory cell array 1a in the block 0 are selected.

In this case, the write array control circuit 12 activates the write array selection signal ARYW0 and deactivates the write array selection signal ARYW1 (which would select the block 1). As a result, the transfer gate 8a (for the writing operation) in the block 0 is turned on, so that the input buffer 7 is connected to the serial/parallel conversion circuit 9a. The transfer gate 8b (for the writing operation) in the block 1 is in an open state, and therefore the input buffer 7 is disconnected from the serial/parallel conversion circuit 9b. Write data W1, W2, W3, etc. are sequentially input to the input buffer 7 from outside. The serial/parallel conversion circuit 9a converts every N bits (i.e., 4 bits in this exemplary case) into parallel data, and feeds the data to the write data buses 15a, that is, WDB0(1), WDB0(2), WDB0(3), and WDB0(4). At this point in time, the N bit (i.e., 4 bit) data do not begin to be output to the write data buses 15a in a simultaneous manner, but begin to be output in a sequential manner as shown in FIGS. 5a–5u.

The length of the period during which the write array selection signal ARYWO remains active is equal to a product of the number of data to be written in the memory cell array 1a of the block 0 multiplied by the duration of each data. Simultaneous with the deactivation of the write array selection signal ARYW0 following this period, another write array selection signal (i.e., the signal ARYW1 in this exemplary case) becomes active, so that the write data from the input buffer is fed to the block 1.

During the above-described operation, the normal-purpose array selection signal ARYN is input from outside to the normal array control circuit 17 via the normal-purpose array selection signal input terminal 19, and is taken into the normal array control circuit 17 in accordance with the fetch clock LATN. The normal array control circuit 17 activates the normal array selection signal ARYN0 or ARYN1 in accordance with the normal-purpose array selection signal ARYN. Herein, the data W1, W2, W3, etc. are to be written into addresses in the memory cell array 1a of the block 0, so that the selection signal ARYN0 for selecting the block 0 is activated. As a result, the read/write circuit 3a, a sense amplifier control circuit 201 for controlling the sense amplifier 2a (shown in FIG. 4), and a row decoder 202 for selecting a word line in the memory cell array 1a in accordance with an externally-provided row address are activated, and every N bits (e.g., 4 bits) of write data input to the write data buses 15a are input to the read/write circuit 3a. The read/write circuit 3a simultaneously outputs the received 4 bits of data W1, W2, W3, and W4 to the sense amplifier 2a via the local data bus LDBO (4:0) (13a). The sense amplifier 2a amplifies the data W1, W2, W3, and W4 before they are fed to bit lines BLO1 to BLO4, respectively. As a result, the data W1 to W4 are written in memory cells which are determined by a word line WL0m and the bit lines BL01 to BLO4, respectively. Similarly, the next 4 bits of data W5, W6, W7, and W8 are simultaneously fed to bit lines BL05 to BL08, respectively. Thus, the writing of data into the memory cell array 1a of the block 0 is completed. The writing of data into the memory cell array 1b of the other block 1 is performed in a similar The normal array selection signal ARYN0 (or ARYN1) must remain active until it is certain that the data input to the corresponding block are written into the respective memory cells. Therefore, even if the corresponding write array selection signal ARYW0 (or ARYW1) shifts from an active state to an non-active state, the normal array selection signal is not switched until all the data are written into the memory cells. Furthermore, the normal array selection signal ARYN0 (or ARYN1) must be activated before data input to the corresponding block reaches the read/write circuit via the serial/parallel conversion circuit, in order for the data to be ready to be written into the corresponding memory cells. It is necessary to take into consideration these two conditions when determining the point in time at which the normal array selection signal ARYN0 or ARYN1 switches from an active state to non-active state and the duration in which the normal array selection signal ARYN0 or ARYN1 is to remain active. Accordingly, a plurality of normal array selection signals can be active at the same time, unlike the write array selection signals. In the present example, as shown in FIGS. 5a–5u, the normal array selection signal ARYN0 provided to the block 0 remains active even after the point in time at which the normal array selection signal ARYN1 provided to the block 1 becomes active.

By using write array selection signals and normal array selection signals having the above-described timing scheme, it becomes possible to incessantly write data into memory cells of different blocks.

Figure 6A:
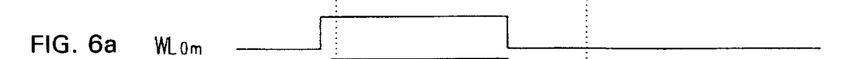
Figure 6B:
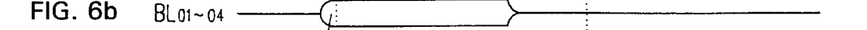
Figure 6C:
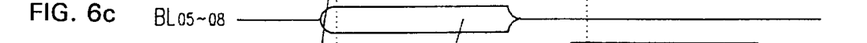
Figure 6D:
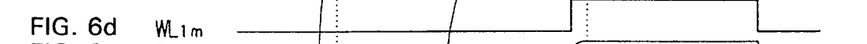
Figure 6E:
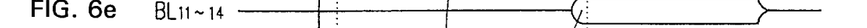
Figure 6F:
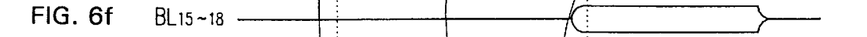
Figure 6G:
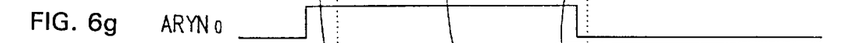
Figure 6H:
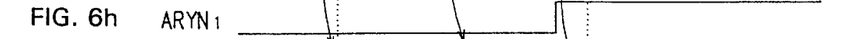
Figure 6I:
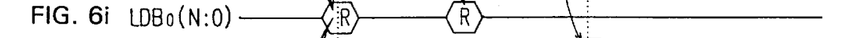
Figure 6J:
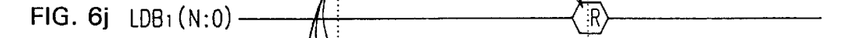
Figure 6K:
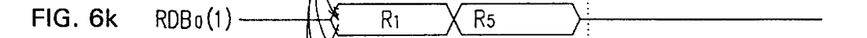
Figure 6L:
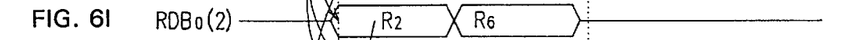
Figure 6M:
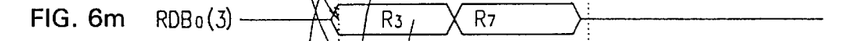
Figure 6N:
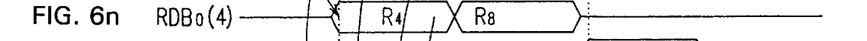
Figure 6O:
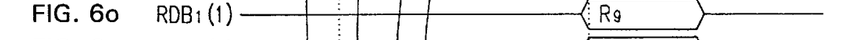
Figure 6P:
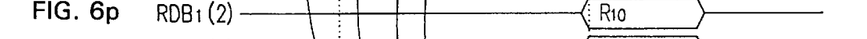
Figure 6Q:
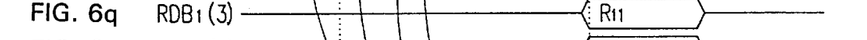
Figure 6R:
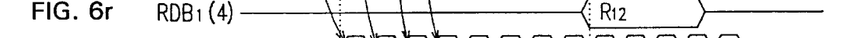
Figures 6S, 6T:
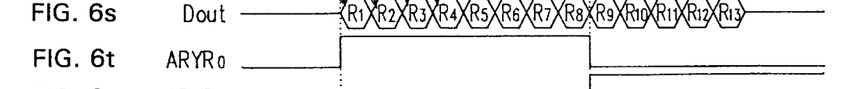
Figure 6U:
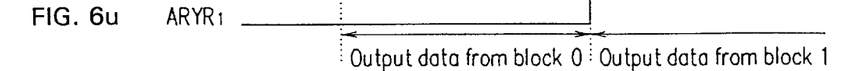

Next, a case will be described where the semiconductor memory device 10 only performs a reading operation, (i.e., reading of data in the memory cell arrays), with reference to FIGS. 6a–6u.

First, reading-purpose array selection signal ARYR, externally provided, is taken into the read array control circuit 11 via the reading-purpose array selection signal input terminal 18 in accordance with the fetch clock LATR. Depending on the block which the addresses (in which data are to be written) indicated by the reading-purpose array selection signal ARYR correspond to the memory cell of, the read array control circuit 11 activates one of a plurality of write array selection signals and deactivates all the other write array selection signals. Herein, a case will be described where addresses in the memory cell array 1a in the block 0 are indicated by the signal ARYR input to the terminal 18.

In this case, the read array control circuit 11 activates the read array selection signal ARYR0 (for selecting the block 0) and deactivates the read array selection signal ARYR1 (which would select the block 1). As a result, the transfer gate 5a (for the reading operation) in the block 0 is turned on, so that the output buffer 6 is connected to the parallel/serial conversion circuit 4a. The transfer gate 5b (for the reading operation) in the block 1 is in an open state, and therefore the output buffer 6 is disconnected from the parallel/serial conversion circuit 4b.

Before one of the plurality of read array selection signals becomes active, the normal array control circuit 17 activates the normal array selection signal provided to the corresponding block. This timing will be described later. Herein, the normal array control circuit 17 activates the normal array selection signal ARYN0 for selecting the block 0. As a result, the read/write circuit 3a, the sense amplifier control circuit 201, and the row decoder 202 are activated, and data R1, R2, R3, and R4 are simultaneously read out from the memory cells selected by the word line WL0m and the bit lines BL01 to BL04, respectively. The sense amplifier 2a amplifies the readout data R1, R2, R3, and R4 before they are fed to the read/write circuit 3a via the local data buses 13a. Next, data R5, R6, R7, and R8 are simultaneously read out from the memory cells determined by the word line WL0m and the bit lines BL05 to BL08, respectively, and output to the read/write circuit 3a. Every 4 bits of the readout data are simultaneously fed to the parallel/serial conversion circuit 4a so as to be converted into serial data, and are output to the transfer gate 5a (for the reading operation). The transfer gate 5a is kept in an ON state by the read array selection signal ARYR0 as described above, and therefore outputs the serial data from the parallel/serial conversion circuit 4a to the output buffer 6.

The length of the period during which the read array selection signal ARYR0 remains active is equal to a product of the number of data to be read out from the memory cell array 1a of the block 0 multiplied by the duration of each data. This period ends when all the data are output from the transfer gate 5a of the block 0. Simultaneous with the deactivation of the read array selection signal ARYR0, another read array selection signal (i.e., the signal ARYR1 in this exemplary case) becomes active, so that the data read out from the memory cell array 1b of the block 1 begin to be output to the output buffer 6 via the transfer gate 5b (for the reading operation of the block 1.

The normal array selection signal ARYN0 (or ARYN1) only needs to remain active from the moment data are read out from the memory cells of the corresponding block and until the moment all the data are output from the read/write circuit. Therefore, the normal array selection signal can be deactivated before the corresponding read array selection signal is deactivated. However, each normal array selection signal must shift from a non-active state to an active state before the corresponding read array selection signal shifts to an active state. Specifically, the point in time at which the normal array selection signal is activated is set so that it is possible to start outputting serial data as soon as the corresponding read array selection signal is activated. It is necessary to take into consideration these two conditions when determining the periods during which the normal array selection signal ARYN0 or ARYN1 remains active. Accordingly, a plurality of normal array selection signals can be active at the same time, unlike the read array selection signals (only one of the read array selection signals can be active, during which time all the other read array selection signals are deactivated). In the present example, as shown in FIGS. 6a–6u, the normal array selection signal ARYN1 provided to the block 1 becomes active (so that data will begin to be read out from the memory cell array 1b of the block 1) before the normal array selection signal ARYN0 provided to the block 0 is deactivated (i.e., before the reading of data from the memory cell array 1a of the block 0 is completed).

By using read array selection signals and normal array selection signals having the above-described timing scheme, it becomes possible to incessantly output data read out from memory cells of different blocks.

Figure 7A:
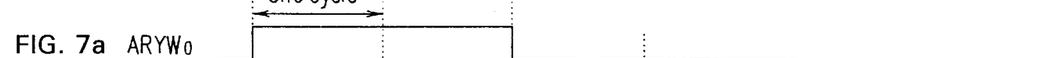
Figures 7B, 7C:
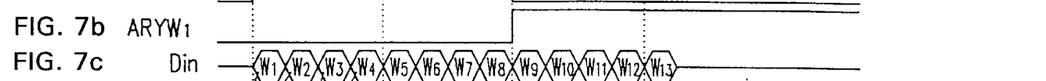
Figures 7D, 7E:
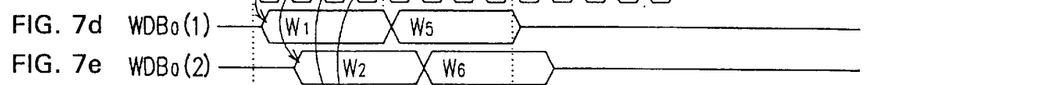
Figures 7F, 7G, 7H:
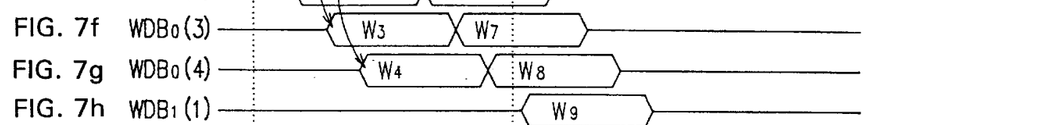
Figures 7I, 7J:
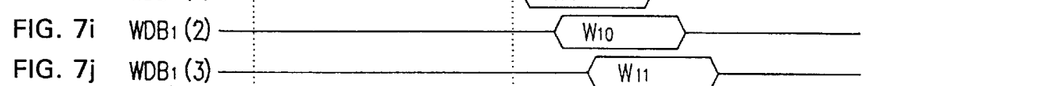
Figures 7K, 7L, 7M:
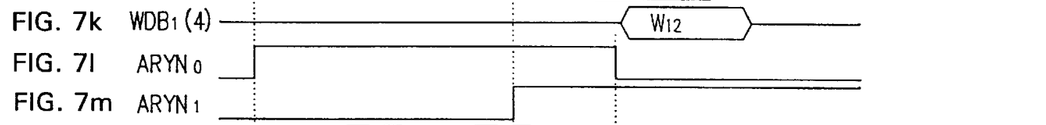
Figures 7N, 7O, 7P:
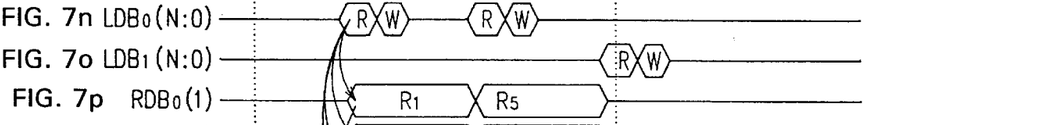
Figures 7Q, 7R, 7S, 7T:
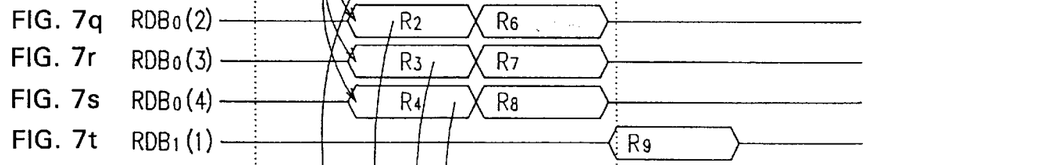
Figures 7U, 7V:
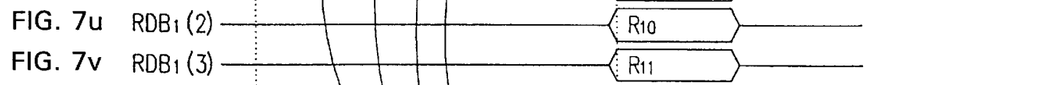
Figures 7W, 7X:
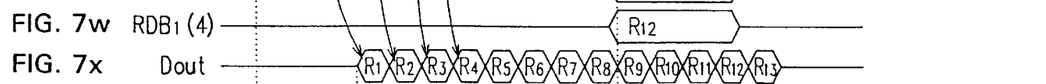
Figures 7Y, 7Z:
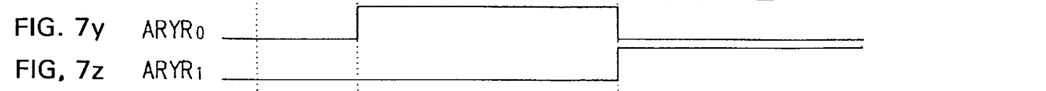

Next, a case will be described where the semiconductor memory device 10 only performs a read-modify writing operation with reference to FIGS. 7a–7z. In the read-modify writing operation, the points in time at which the normal array selection signals are switched are determined while taking into consideration both the points in time at which the write array selection signals are switched and the points in time at which the read array selection signals are switched.

First, one of the blocks is selected by a writing-purpose array selection signal ARYW, and the write array selection signal to be fed to that block is activated. The other write array selection signals remain deactivated. Herein, it is assumed that the block 0 is selected. Next, as in the case of the above-described writing operation, data input from outside to the input buffer 7 are input to the serial/parallel conversion circuit 9a via the transfer gate 8a (for the writing operation) in the block 0. Every 4 bits of the data are converted into parallel data in the serial/parallel conversion circuit 9a and are fed to the write data buses WDB (N:0) (15a).

In the meantime, the normal-purpose array selection signal ARYN indicating the same addresses that the above-mentioned writing-purpose array selection signal ARYW indicates is input to the normal array control circuit 17 via the terminal 19. In response, the normal array control circuit 17 activates one of a plurality of normal array selection signals. In this exemplary case, the normal array selection signal ARYN0 for selecting the block 0 is activated. As a result, the read/write circuit 3a, the sense amplifier control circuit 201, and the row decoder 202 are activated, so that data are read out from the memory cell array 1a as in the case of the above-described reading operation, and are amplified by the sense amplifier 2a before being output from the read/write circuit 3a to the read data buses LDB (N:0) (14a). Thereafter, write data from the write data buses 15a are fed to the read/write circuit 3a, and are written into the memory cells from which data were read out. Thus, reading and writing of data are performed for the same memory cells by selecting addresses only once.

Furthermore, the reading-purpose array selection signal ARYR indicating the same addresses that the above-mentioned normal-purpose array selection signal ARYN indicates is input to the read array control circuit 11 via the terminal 18. In response, the read array control circuit 11 activates one of a plurality of read array selection signals. In this exemplary case, the read array selection signal ARYR0 for selecting the block 0 is activated. As a result, the parallel/serial conversion circuit 4a of the block 0 is connected to the output buffer 6 via the transfer gate 5a (for the reading operation), so that the readout data which were simultaneously output to the read data buses LDB (N:0) (14a) are converted into serial data by the parallel/serial conversion circuit 4a and output to the output buffer 6. When all the readout data are output to the output buffer 6, the read array selection signal ARYR0 is deactivated, and the other read array selection signals are activated at the same time.

The read-modify writing operation by the semiconductor memory device 10 of the present invention is performed in the above-described manner. In this operation, the length of the period during which the respective selection signals remain active and the points in time at which the respective selection signals shift from an active state to a non-active state are determined in the following manner.

First, the length of the period during which each write array selection signal remains active is equal to a product of the number of data to be written multiplied by the duration of each data, as stated in the description of the writing operation. When a write array selection signal fed to one block shifts from an active state to a non-active state, a write array selection signal fed to another block is activated at the same time. In other words, among all the write array selection signals fed to a plurality of blocks, only the write array selection signal fed to one of the blocks can be active. Similarly, the length of the time period during which each read array selection signal remains active is equal to a product of the number of data to be read out multiplied by the duration of each data. When one of the read array selection signals to be fed to a plurality of blocks is active, all the other read array selection signals are non-active.

The point in time at which each normal array selection signal is activated is determined while taking into consideration at least the following two conditions: In order to activate the read/write circuit, the normal array selection signal must be activated before the data to be written is output to the write data buses RDB (N:0) via the corresponding serial/parallel conversion circuit and is input to the corresponding read/write circuit. Secondly, in order to allow data to be output to the output buffer as soon as the read array selection signal is activated, the read/write circuit and the corresponding sense amplifier must be activated (so as to read out data from the memory cells and convert the data into serial data) before the read array selection signal is activated. The point in time at which the respective normal array selection signals are activated is determined so as to satisfy these two conditions. Although the normal array selection signal is activated in synchronization with the write array selection signal in the exemplary case shown in FIGS. 7a–7z, this synchronization is not necessary.

The normal array selection signals only need to remain active from the moment all the data are written and until the moment all the data read out from the memory cells are output. Although the normal array selection signal is activated in synchronization with the read array selection signal in the exemplary case shown in FIGS. 7a–7z, this synchronization is not necessary. Furthermore, since the points in time at which the respective normal array selection signals are activated or deactivated are determined in the above-mentioned manner, it is possible for normal array selection signals fed to a number of blocks to be simultaneously active, as shown in FIGS. 7a–7z.

As described above, in accordance with the semiconductor memory device 10, to which the block division technique is applied, it is made possible to incessantly input/output data in a read-modify writing operation by controlling each one of a plurality of blocks with three kinds of signals: write array selection signals for controlling input of data into the block, read array selection signals for controlling output of date from the block, and normal array selection signals for controlling the access to the memory cell array in the block.

Figure 2C:
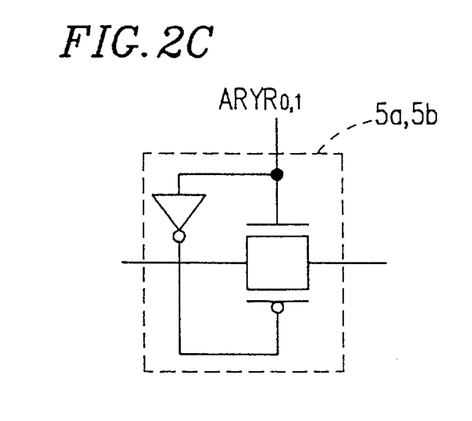
FIG. 2C is a diagram showing an exemplary configuration for a transfer gate for a writing operation.
Figure 2D:
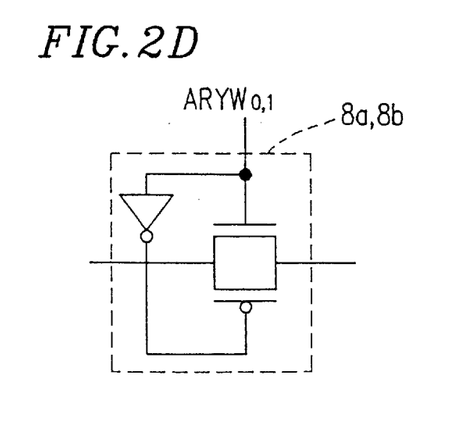
FIG. 2D is a diagram showing an exemplary configuration for a transfer gate for a reading operation.

Although the present example was described with respect to a case where the transfer gates 5a, 5b, 8a, and 8b are n-type transistors, the same explanation can also be applied to a case where the transfer gates 5a, 5b, 8a, and 8b are p-type transistors by reversing the logic operations performed by the read array selection signals ARYR0 and ARYR1, and the write array selection signals ARYW0 and ARYW1. Moreover, it is also possible to apply the same explanation to a case where the transfer gates 5a, 5b, 8a, and 8b have CMOS configurations as shown in FIGS. 2C and 2D. It is also applicable to adopt other circuits having similar functions.

Although a case was described where the semiconductor memory device 10 includes two blocks having memory cell arrays, the same explanation can also be applied to a case where three or more blocks are provided.

Although a case was described where the bit width N of the internal parallel data is 4 (bits), the same explanation can also be applied to a case where N=2 bits, N=3 bits, or N$\geq$5 bits.

In the above example, a circuit having the configuration shown in FIG. 3C was used as a control circuit section having a read array control circuit, a normal array control circuit, and a write array control circuit. However, similar effects can be attained by using a control circuit section having the configuration shown in FIG. 3A or 3B.

Figure 3A:
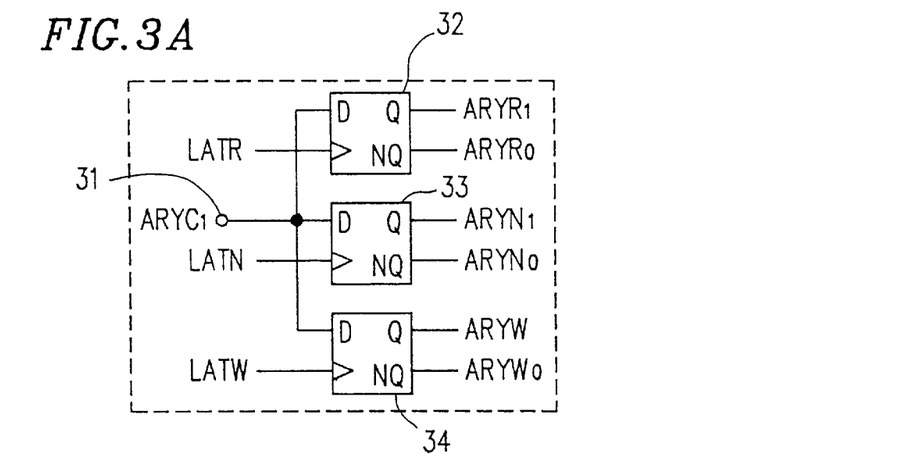
FIGS. 3A to 3C are diagrams showing exemplary configurations for a control circuit section of the semiconductor memory device shown in FIG. 1.

FIG. 3A is a view showing another example of the control circuit section 16. In FIG. 3A, a read array control circuit 32, a normal array control circuit 33, and a write array control circuit 34 have functions similar to those of the above-described read array control circuit 11, the normal array control circuit 17, and the write array control circuit 12, respectively. In this configuration, a common array selection signal input terminal 31 is used instead of incorporating three separate input terminals, i.e., the reading-purpose array selection signal input terminal 18, the writing-purpose array selection signal input terminal 20, and the normal-purpose array selection signal input terminal 19. The common array selection signal input terminal 31 receives a logical sum (AND) signal of the reading-purpose array selection signal ARYR, the writing-purpose array selection signal ARYW, and the normal-purpose array selection signal ARYN as a common array selection signal ARYC1 from outside. The same explanation given to the above example can be applied to the case where a control circuit section having this configuration is employed. The D flip-flop can be In the case where a control circuit section having this configuration is employed, the number of input terminals can be reduced as compared with the above-described case, so that the chip area and the production cost for the chip can be decreased.

Figure 3B:
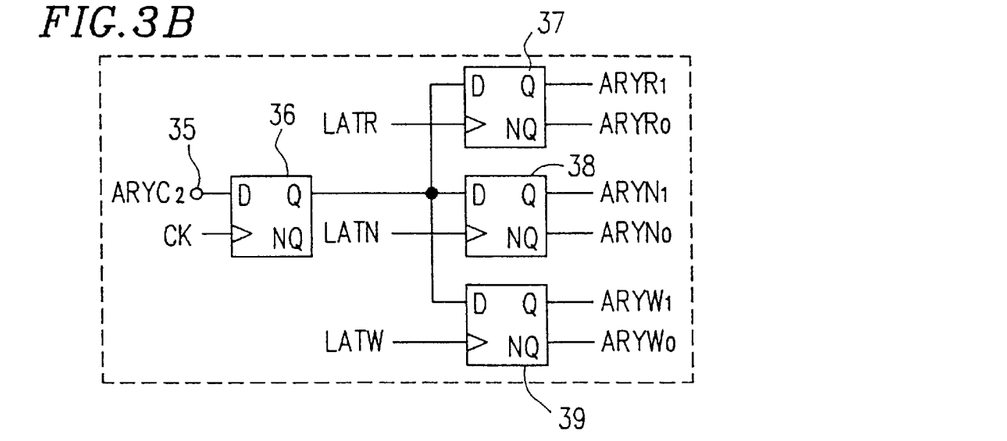
Figure 3C:
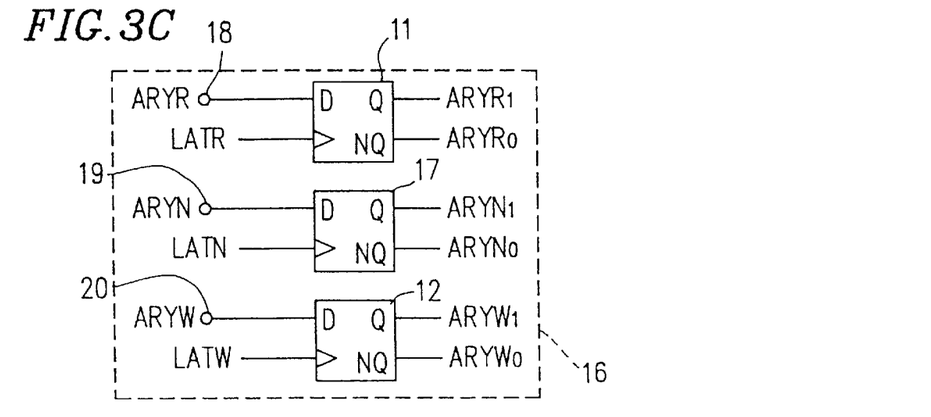

FIG. 3B is a view showing still another example of the control circuit section. In FIG. 3B, a read array control circuit 37, a normal array control circuit 38, and a write array control circuit 39 have functions similar to those of the above-described read array control circuit 11, the normal array control circuit.17, and the write array control circuit 12, respectively. In this configuration, an input latch 36 is provided between a common array selection signal input terminal 35 and the control circuits 37, 38, and 39. The input latch 36 retains a common array selection signal ARYC2 taken from outside for a certain period of time. The common array selection signal input terminal 35 receives a logical sum (AND) signal of a read array selection signal, a write array selection signal, and a normal array selection signal as a common array selection signal ARYC2 from outside. The same explanation to the above example can be applied to the case where a control circuit section having this configuration is employed. The D flip-flop can be replaced by another circuit having a similar function. In the case where a control circuit section having the configuration shown in FIG. 3B is employed, the input timing of the common array selection signal ARYC is required to satisfy less severe conditions, so that external control circuits (if any) used in connection with the device can be simplified.

In the semiconductor memory device 10 according to the present example, the component elements of each block, i.e., the memory cell array, sense amplifier, transfer gate (for the writing operation), serial/parallel conversion circuit, read/write circuit, parallel/serial conversion circuit, and transfer gate (for the reading operation) are all formed on one chip. However, it is not necessary to form all the component elements constituting one block an the same chip. In the present example, all the component elements, including the serial/parallel conversion circuit and the parallel/serial conversion circuit, are formed on the same chip, and the serial/parallel conversion and parallel/serial conversion circuit are each performed in two steps. Therefore, the data bus width can be reduced, which allows reduction of the size of each chip.

In accordance with the semiconductor memory device of the present invention, data is provided to or received from a read/write circuit, a serial/parallel conversion circuit, and a parallel/serial conversion circuit for performing inputting and outputting of data in memory cell arrays by way of a transfer gate for the writing operation (controlled by a write array selection signal) and a transfer gate for the reading operation (controlled by a read array selection signal). As a result, it becomes possible to perform a read-modify writing operation and inputting/outputting data in an incessant or continuous manner, thereby reducing the power consumption by array division technique. Thus, there is provided a high-performance semiconductor memory device capable of incessantly inputting/outputting data, which in turn improves the performance of any system incorporating the semiconductor memory device. Moreover, since it is relatively easy to produce the high-performance semiconductor memory device, the amount of time required for designing the chip can be reduced, which will enable the development of further modifications of the device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising a plurality of blocks, a plurality of first selection signals and a plurality of second selection signals being provided to the plurality of blocks, wherein each of the plurality of blocks includes:
  a memory cell array;
  a read/write circuit for simultaneously reading out a plurality of data from the memory cell array when a corresponding one of the plurality of first selection signals is active;
  a parallel/serial conversion circuit for outputting the plurality of simultaneously read out data, the outputting being performed data by data in a serial manner along the time axis; and
  a gate controlled by a corresponding one of the plurality of second selection signals, the gate outputting the plurality of data from the parallel/serial conversion circuit when the corresponding one of the plurality of second selection signals is active, and
wherein only one of the plurality of second selection signals is allowed to be active at a given time, while the other second selection signals remain non-active.

2. A semiconductor memory device according to claim 1, wherein each of the plurality of first selection signals becomes active before a corresponding one of the plurality of second selection signals becomes active, and a duration of the first selection signal partially overlaps with a duration of the corresponding one of the plurality of second selection signals.

3. A semiconductor memory device comprising a plurality of blocks, a plurality of first selection signals and a plurality of second selection signals being provided to the plurality of blocks, wherein each of the plurality of blocks includes:
  a memory cell array;
  a read/write circuit for simultaneously writing a plurality of data into the memory cell array when a corresponding one of the plurality of first selection signals is active;
  a serial/parallel conversion circuit for receiving the plurality of data, the data being sequential, and for outputting the plurality of sequential data to the read/write circuit in a parallel manner along the time axis;

a gate controlled by a corresponding one of the plurality of second selection signals, the gate outputting the plurality of sequential data to the serial/parallel conversion circuit when the corresponding one of the plurality of second selection signals is active, and wherein only one of the plurality of second selection signals is allowed to be active at a given time, while the other second selection signals remain non-active.

4. A semiconductor memory device according to claim 3, wherein each of the plurality of first selection signals becomes non-active after a corresponding one of the plurality of second selection signals becomes non-active, and a duration of the first selection signal partially overlaps with a duration of the corresponding one of the plurality of second selection signals.

5. A semiconductor memory device comprising a plurality of blocks, a plurality of first selection signals, a plurality of second selection signals, and a plurality of third selection signals being provided to the plurality of blocks, wherein each of the plurality of blocks includes:
a memory cell array;
a read/write circuit for simultaneously reading out a plurality of data from the memory cell array and subsequently simultaneously writing a plurality of further data into the memory cell array when a corresponding one of the plurality of first selection signals is active;
a parallel/serial conversion circuit for outputting the plurality of simultaneously read out data, the outputting being performed data by data in a serial manner along the time axis;
a transfer gate for a reading operation controlled by a corresponding one of the plurality of second selection signals, the gate outputting the plurality of data from the parallel/serial conversion circuit when the corresponding one of the plurality of second selection signals is active;
a serial/parallel conversion circuit for receiving the plurality of further data, the further data being sequential, and for outputting the plurality of sequential data to the read/write circuit in a parallel manner along the time axis; and
a transfer gate for a writing operation controlled by a corresponding one of the plurality of third selection signals, the gate outputting the plurality of sequential data to the serial/parallel conversion circuit when the corresponding one of the plurality of third selection signals is active, and wherein only one of the plurality of second selection signals is allowed to be active at a given time, while the other second selection signals remain non-active, and only one of the plurality of third selection signals is allowed to be active at a given time, while the other third selection signals remain non-active.

6. A semiconductor memory device according to claim 5, wherein each of the plurality of first selection signals becomes active before a corresponding one of the plurality of second selection signals becomes active and becomes non-active after a corresponding one of the plurality of third selection signals becomes non-active, and a duration of each of the plurality of first selection signals partially overlaps with a duration of the corresponding one of the plurality of second selection signals and with a duration of the corresponding one of the plurality of third selection signals.

7. A semiconductor memory device according to claim 1 further comprising a control circuit section for generating the plurality of first selection signals and the plurality of second selection signals.

8. A semiconductor memory device according to claim 3 further comprising a control circuit section for generating the plurality of first selection signals and the plurality of second selection signals.

9. A semiconductor memory device according to claim 5 further comprising a control circuit section for generating the plurality of first selection signals, the plurality of second selection signals, and the plurality of third selection signals.

10. A semiconductor memory device according to claim 9, wherein the control circuit section comprises:
a first input terminal for receiving from outside a first array selection signal indicating a block to be selected;
a first control circuit for generating the first selection signal based on the first array selection signal;
a second input terminal for receiving from outside a second array selection signal indicating a block to be selected;
a second control circuit for generating the second selection signal based on the second array selection signal;
a third input terminal for receiving from outside a third array selection signal indicating a block to be selected; and
a third control circuit for generating the third selection signal based on the third array selection signal.

11. A semiconductor memory device according to claim 9, wherein the control circuit section comprises:
a common input terminal for receiving from outside a common array selection signal indicating a block to be selected; and
a first control circuit for generating the first selection signal based on the common array selection signal;
a second control circuit for generating the first selection signal based on the common array selection signal; and
a third control circuit for generating the first selection signal based on the common array selection signal.

12. A semiconductor memory device according to claim 11, wherein the control circuit section further comprises an input latch provided between the common input terminal and the first, second, and third control circuits, the input latch receiving and retaining the common array selection signal.

13. A semiconductor memory device according to claim 1, wherein the parallel/serial conversion circuit converts every N bits of the plurality of simultaneously read out data into sequential data and outputs the converted data, N being a positive integer.

14. A semiconductor memory device according to claim 5, wherein the parallel/serial conversion circuit converts every N bits of the plurality of simultaneously read out data into sequential data and outputs the converted data, N being a positive integer.

15. A semiconductor memory device according to claim 3, wherein the serial/parallel conversion circuit receives the plurality of sequential data and outputs every N bits of the received data to the read/write circuit in a parallel manner along the time axis, and the read/write circuit simultaneously writes each N bits of parallel data into the memory cell array, N being a positive integer.

16. A semiconductor memory device according to claim 5, wherein the serial/parallel conversion circuit receives the plurality of sequential data and outputs every N bits of the received data to the read/write circuit in a parallel manner along the time axis, and the read/write circuit simultaneously writes each N bits of parallel data into the memory cell array, N being a positive integer.

17. A semiconductor memory device according to claim 14, wherein the serial/parallel conversion circuit receives the plurality of sequential data and outputs every N bits of the received data to the read/write circuit in a parallel manner along the time axis, and the read/write circuit simultaneously writes each N bits of parallel data into the memory cell array, N being a positive integer.

18. A semiconductor memory device according to claim 1, wherein the plurality of blocks are formed on one chip.

19. A semiconductor memory device according to claim 3, wherein the plurality of blocks are formed on one chip.

20. A semiconductor memory device according to claim 5, wherein the plurality of blocks are formed on one chip.

* * * * *